United States Patent
Seng et al.

(10) Patent No.: US 7,617,471 B1
(45) Date of Patent: Nov. 10, 2009

(54) PROCESSOR EVENT INTERFACE FOR PROGRAMMABLE INTEGRATED CIRCUIT BASED CIRCUIT DESIGNS

(75) Inventors: Shay Ping Seng, San Jose, CA (US); William Edward Allaire, West Chester, PA (US); Paul Travis Mobbs, San Francisco, CA (US); Jing Zhao Ou, Sunnyvale, CA (US)

(73) Assignee: XILINX, Inc., San Jose, CA (US)

( * ) Notice: Subject to any disclaimer, the term of this patent is extended or adjusted under 35 U.S.C. 154(b) by 222 days.

(21) Appl. No.: 11/714,041

(22) Filed: Mar. 5, 2007

(51) Int. Cl.
*G06F 17/50* (2006.01)
(52) U.S. Cl. .................... 716/17; 716/1; 716/2; 716/18
(58) Field of Classification Search ................ 716/1, 716/2, 17, 18
See application file for complete search history.

(56) References Cited

U.S. PATENT DOCUMENTS

2007/0043531 A1* 2/2007 Kosche et al. ............... 702/182

OTHER PUBLICATIONS

Seng, Shay Ping, "Method and Apparatus for Interfacing Instruction Processors and Logic in an Electronic Circuit Modeling System", U.S. Appl. No. 11/633,977, filed Dec. 5, 2006, 23 pp., available from Xilinx, Inc., 2100 Logic Drive, San Jose, CA 95124.

* cited by examiner

*Primary Examiner*—Thuan Do
(74) *Attorney, Agent, or Firm*—Kevin T. Cuenot (57) ABSTRACT

A method of implementing a circuit design on a programmable integrated circuit can include displaying a list of at least one memory of the circuit design that is associated with the processor. A plurality of attributes of an event for the processor can be received. The plurality of attributes can specify a condition that, when met within at least one memory from the list, causes a signal to be generated to the processor. A description of an event interface for the processor can be automatically created according to the plurality of attributes of the interrupt. The description of the event interface can be incorporated into a description of the circuit design.

19 Claims, 4 Drawing Sheets

| Memory Type | Function Name | Description |
| --- | --- | --- |
| FIFO | xlDataCount | Number of data items in FIFO |
| FIFO | xlEmpty | FIFO empty status |
| Register | XIDataRead | Returns 1 if the data in the register has been read |
| Register | xlDataChanged | Returns 1 if the data in the register has changed since the last time the register was read |

```
#define START_AC 0
#define STOP_AC 1
define INTRUDER_DETECTED 2 voice _sg_interrupt_handler () {
        UINT _int_vec = xlGetInterruptVector();
        switch _int_vec {
                case START_AC:
                        // - - Add code here - -
                        break;
                case STOP_AC:
                        // - - Add code here - -
                        break;
                case INTRUDER_DETECTED:
                        // - - Add code here - -
                        break;
        }
}
```

PROCESSOR EVENT INTERFACE FOR PROGRAMMABLE INTEGRATED CIRCUIT BASED CIRCUIT DESIGNS

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

1. Technical Field

The present invention relates to programmable logic devices and, more particularly, to creating an event interface for a processor using a programmable logic device.

2. Description of the Related Art

Electronic circuit designs can be constructed, simulated, debugged, and translated into electronic hardware using a High Level Modeling System (HLMS). Typically, an HLMS is implemented as a software-based design tool which provides blocks that can be combined to build an electronic circuit. A block, also called a module, refers to a high level software construct that represents a particular circuit function, such as multiplexing, addition, multiplication, or the like. Blocks may have ports that can produce and consume signals, and may be arranged within the HLMS to form a circuit and/or system. Communication among the blocks can be represented by wires, or signals, that graphically link the blocks. The design may be simulated within the HLMS once it is constructed. Some HLMS tools can generate a hardware implementation from the block representation of the circuit design. For example, an HLMS may generate the bitstream necessary to program a programmable logic device (PLD) or generate the hardware description language (HDL) files necessary to specify the hardware design.

PLDs are a well-known type of integrated circuit. A PLD can be programmed by a user to perform specified logic functions. There are different types of PLDs, such as programmable logic arrays (PLAs), complex programmable logic devices (CPLDs), and field programmable gate arrays (FPGAs). An FPGA, for example, typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure can be programmed by loading a stream of configuration data, referred to as a bitstream, into internal configuration memory cells that define how the CLBs, IOBs, and interconnect structure are configured. An FPGA may also include various dedicated logic circuits, such as memories, microprocessors, digital clock managers (DCMs), and input/output (I/O) transceivers. Other types of FPGAs may have different structures or architectures, and may include other types of resources, both programmable and non-programmable, and are well-known to those of skill in the art.

One example of an HLMS is System Generator for DSP, available from Xilinx, Inc. of San Jose, Calif. System Generator for DSP is a system level modeling tool that facilitates FPGA hardware design. System Generator for DSP provides a wide range of blocks that can be automatically compiled into a design suitable for an FPGA. Among these blocks are high level abstractions that implement complex functions, including digital signal processing as well as communication and control logic. In addition, access to underlying FPGA resources can be provided through low level block abstractions that facilitate the construction of highly efficient FPGA designs.

As noted above, FPGAs can include processors that are embedded on the device. Such processors can include a microprocessor core, as well as associated control logic. An embedded processor can include embedded hardware or embedded firmware or a combination thereof for a "hard" or "soft" microprocessor. A soft microprocessor can be implemented using the programmable logic (e.g., CLBs, IOBs). For example, a MicroBlaze™ soft microprocessor, available from Xilinx, Inc., may be employed. A hard microprocessor can be implemented using an IBM POWER PC™, Intel PENTIUM™, AMD ATHLON™, or like type of processor core known in the art.

When a processor is incorporated into a circuit design, whether embedded on the PLD or located "off-chip", interrupts must be defined that inform the processor when a particular event has occurred that requires the attention of the processor. Typically, interrupts are generated or raised by peripherals. In the context of an FPGA, a peripheral can refer to user logic or other devices. The particular reason why an interrupt is raised can vary, but examples can include, a first-in-first-out memory (FIFO) being full and requiring a read operation, a FIFO is nearly full and instruction from the processor is needed, or the like.

Processors, whether implemented on an FPGA or as a standalone processor, have a limited number of interrupt ports. Peripherals and other devices that generate interrupt signals must share these ports. Accordingly, one aspect of designing a system that includes a processor is creating an interface that can manage the interrupts being provided to the processor. When more than one interrupt is generated, the interface must collect interrupt signals and prioritize those signals according to importance.

Creating this interrupt interface to the processor can be a tedious and time consuming task. The circuit designer must manage a large amount of hardware and software control logic and/or code. A similar situation exists with respect to direct memory access (DMA) events. A DMA event refers to the case where data is to be transferred between memory and another peripheral device. A DMA transfer typically involves a DMA controller, which can be considered a particular type, or special purpose, type of processor. Memories requiring a DMA action submit DMA requests to the DMA controller asking for the DMA event to be initiated.

SUMMARY

The present invention relates to creating event interfaces for processors using a programmable integrated circuit (IC). One embodiment of the present invention can include a method of implementing a circuit design on a programmable IC. The method can include displaying a list of one or more memories of the circuit design that are associated with a processor of the circuit design and receiving a plurality of attributes of an event for the processor. The plurality of attributes can specify a condition that, when met within at least one memory from the list, causes a signal to be generated to the processor. The method also can include automatically creating a description of an event interface for the processor according to the plurality of attributes of the event and incorporating the description of the event interface into a description of the circuit design.

Receiving a plurality of attributes can include, but is not limited to, receiving user input specifying an event label for the event, trigger code specifying the condition that must be met in the memory to generate the event, a priority for the event, and/or a trigger level for the event. One or more predetermined functions can be provided that determine a state of the memory. The predetermined function(s) can be referenced by the trigger code.

The method can include generating a bitstream from the description of the circuit design that, when loaded into the programmable IC, instantiates the circuit design including the event interface. Automatically creating a description of an event interface can include automatically generating at least one of event generation hardware and event handling software, according to the plurality of attributes of the event.

In the case where a plurality of events is specified, each event having a respective plurality of attributes including a priority, automatically creating a description of an event interface for the processor can include generating a description of an event interface to the processor according to the plurality of events.

Another embodiment of the present invention can include a method of implementing a circuit design on a programmable IC. The method can include receiving user input specifying a plurality of attributes of an event for a processor of the circuit design. The plurality of attributes can include user-specified trigger code that determines a condition that, when met, causes a signal to be generated to the processor. The method also can include automatically creating an event interface comprising event generating hardware and event handling software, for the processor, according to the plurality of attributes of the event. At least a portion of the event interface can be incorporated into a description of the circuit design.

The method also can include presenting a graphical user interface displaying a list of at least one memory of the circuit design that is associated with the processor. The condition that is determined by the trigger code can exist in a memory of the circuit design. Receiving user input specifying a plurality of attributes can include, but is not limited to, receiving user input including a priority of the event and receiving user input including a trigger level for the event. In another embodiment, the processor can be selected to be a direct memory access controller.

Yet another embodiment of the present invention can include a computer program product including a computer-usable medium having computer-usable program code that, when executed by an information processing system, causes the information processing system to perform the various steps and/or functions disclosed herein.

DETAILED DESCRIPTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The embodiments disclosed herein relate to the automatic generation of an event interface for a processor using a programmable logic device (PLD), such as a field programmable gate array (FPGA). The interface can be used to handle events such as interrupt type events and/or direct memory access (DMA) events that are to be provided to the processor. A "processor", as used herein, can refer to a microprocessor, a processor core (which may be either hard or soft, as previously described), whether embedded on a PLD or as a separate integrated circuit, and/or a DMA controller. A circuit design tool such as a high level modeling system (HLMS) can provide an interface through which users can define events for a processor. As used herein, an event can include, but is not limited to, a particular condition arising in a memory and/or a signal being generated on a wire.

In one embodiment of the present invention, a design tool such as an HLMS can associate memory resources of the circuit design, or circuit description, with a processor that will be incorporated into an electrical system. With the information specified through the HLMS interface, the HLMS can automatically generate an event interface to the processor that comprises hardware and/or software for detecting and handling the various events.

Figure 1:
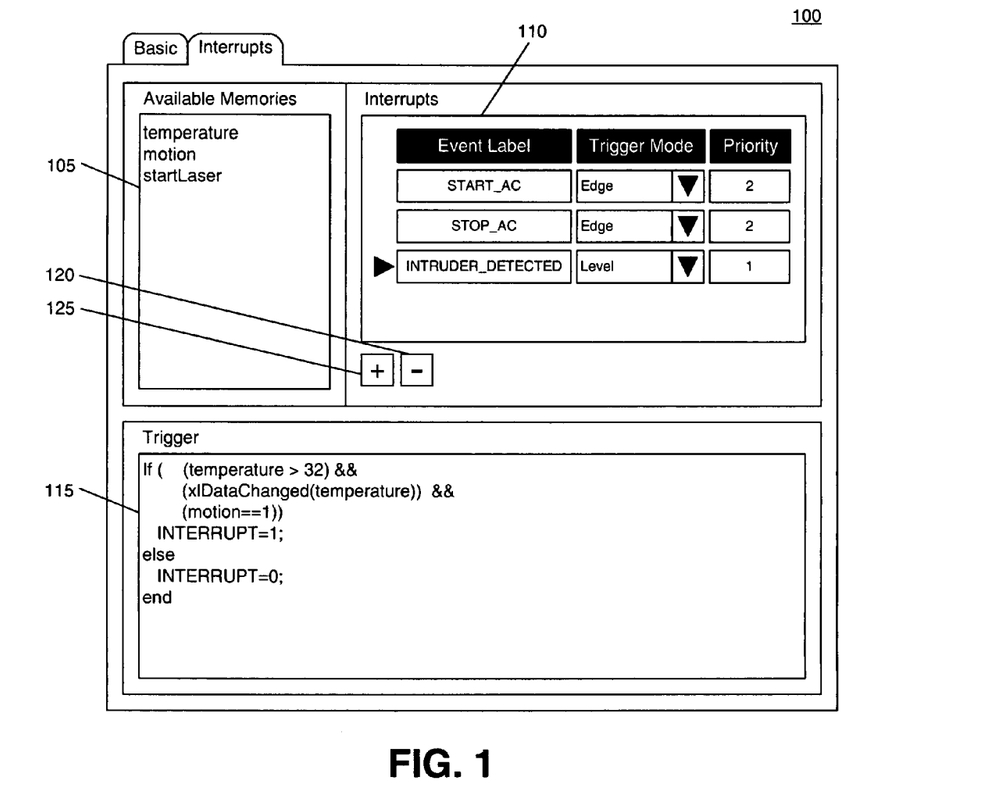
FIG. 1 is a view of a graphical user interface (GUI) of a high level modeling system (HLMS) in accordance with one embodiment of the present invention.

FIG. 1 is a view of a graphical user interface (GUI) 100 of an HLMS in accordance with one embodiment of the present invention. For purposes of illustration, it can be assumed that a programmatic circuit description has been loaded into the HLMS. The circuit description can reference a processor, which can be disposed on, or embedded within, the PLD or can be communicatively linked with the PLD, but not disposed on the PLD. In any case, the processor can be associated with one or more shared memories that interface the user logic and/or any other peripherals with the processor. The GUI 100 can be presented responsive to a user request. For example, the circuit designer can request that the GUI 100 be presented by double clicking on a visual representation of the processor that may be displayed within a view of the HLMS or by selecting a command to manage processor events. Through the GUI 100, the circuit designer can add, delete, and/or modify existing events for the processor included in the circuit description.

The GUI 100 can include three windows 105, 110, and 115. Window 105 can present a list of one or more memories that have been defined in the circuit description loaded within the HLMS. The memories presented within window 105 have been associated with the processor for which events are being defined or otherwise managed. While the term "memory" can reference a memory having more than one location, as used herein, the term "memory" also can include, or refer to, a memory having a single location. In any case, the memories presented within window 105 can be identified and referenced using user-specified names such as "temperature", "motion", and "startLaser". These user-specified names can be used to refer to particular memories within the programmatic circuit description that is to be synthesized.

Window 110 can present a list or table of interrupt type events that have been defined for the processor. Each event can include or be associated with a plurality of attributes. These attributes can include, but are not limited to, a user-specified event label, a trigger mode, a priority, and trigger code. The "Event Label" can be a text string that the circuit designer can provide or input into the HLMS. Typically, the "Event Label" is chosen to make the resulting software code more readable for a human being.

The "Trigger Mode" refers to the interrupt signal generation mode. This, for example, can be "edge triggered" or "level triggered". An edge triggered interrupt mode can check an interrupt condition on the rising edge of a clock signal. If the interrupt condition is met, a signal pulse of one cycle will be generated on the interrupt line. On the next clock cycle, if the condition is still present, another pulse will be generated, etc. A level triggered interrupt mode will check an interrupt condition on the rising edge of a clock as well. Once an interrupt condition is met, however, the interrupt signal will remain high until a reset is sent to clear the interrupt.

The "Priority" determines the priority of one event in relation to another event if a plurality of events occur at or about the same time, e.g., concurrently. For example, the event having a label of "START_AC" can have an "edge" trigger mode and a priority of 2. The event having a label of "INTRUDER_DETECTED" can have a "level" trigger mode and a priority of 1. The event interface that will be generated according to the information specified within the GUI 100 will give an "INTRUDER_DETECTED" event a higher priority than a "START_AC" event in terms of event handling, whether such events are interrupts or DMA events.

Additional events can be created by selecting the GUI element 125. Selection of GUI element 125 can cause an additional, blank line to be displayed within window 110 through which the circuit designer can define a new event. The circuit designer can specify an "Event Label", a "Trigger Mode", and a "Priority". Trigger code also can be provided for the new event. Selecting GUI element 120, while an event is selected within window 110, can cause that event to be purged or deleted.

The trigger code, or callback, for a selected event, e.g., "INTRUDER_DETECTED" as denoted by the indicator to the left of the event labels, is displayed within window 115. As each different event is selected within window 110, the trigger code associated with that event can be added, edited, deleted, or otherwise modified through window 115. That is, the window 115 can become active and dynamically change the contents that are presented therein according to the selected event in window 110 to receive and/or display trigger code for the selected event.

Since the "INTRUDER_DETECTED" event is selected, the trigger code for that event is displayed within window 115. The trigger code for an event defines the condition(s) that must exist within one or more memories listed in window 105, which can be referenced by name, within that portion of trigger code for the selected event to be initiated or detected. The trigger code also can detect conditions such as the occurrence of a particular signal, etc., within the circuit design. In other words, trigger code determines whether a particular interrupt or DMA event, as reference by the "Event Label", is detected. The trigger code is processed by the HLMS to create or synthesize hardware to perform the functions described by the trigger code.

As indicated by the trigger code shown in window 115, an "INTRUDER_DETECTED" interrupt is thrown if the value stored in the memory register labeled "temperature" is larger than 32, and if the data stored in "temperature" has changed since the register was last read, and if the register "motion" indicates a value of 1, i.e., that motion was detected. If those conditions are met, the global variable INTERRUPT is set to a value of 1, at which point an interrupt can be raised. The function "xIDataChanged" can be a predefined function that determines whether data has changed in a specified register since the last time data was read from that register. Predefined functions can be made available to the circuit designer as a standard library through the HLMS.

GUI 100 allows a circuit designer to select a processor, view one or more memories associated with that processor for a given system or circuit design, as well as define events to the processor. These events can include interrupts and/or DMA events. For a given event, the circuit designer can define an event label, a trigger mode, a priority, as well as trigger code. It should be appreciated that the GUI 100 is provided for purposes of illustration only and is not intended to suggest that any one type of GUI should be used or otherwise limit the embodiments disclosed herein. For example, different visual elements can be used other than those shown and various audible cues can be provided as well.

Figure 2:
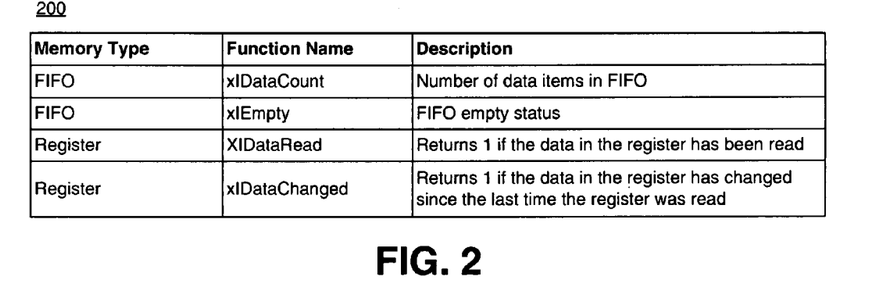
FIG. 2 is a table illustrating predefined functions in accordance with another embodiment of the present invention.

FIG. 2 is a table 200 illustrating predefined functions in accordance with another embodiment of the present invention. The HLMS can be preprogrammed with a library of one or more functions suited to detecting particular conditions within memory resources. These functions can be referenced or incorporated into trigger code for a given event and synthesized into hardware along with the trigger code in which the functions are incorporated. Other functions (not shown) can be provided that detect the occurrence of signals or particular values on selected wires, which also can be incorporated into trigger code for a given event.

For example, table 200 includes a list, or library, of four functions including "xIDataCount", "xIEmpty", "xIDataRead", and "xIDataChanged". The functions "xIDataCount" and "xIEmpty" are intended to operate with, or upon, first-in-first-out (FIFO) memory types. The functions "xIDataRead" and "xIDataChanged" are intended to operate with or upon register memory types. As shown in table 200, the function "xIDataCount" can determine the number of data items in a FIFO. This can be expressed or interpreted in any of a variety of different formats, e.g., the percentage of the FIFO that is full, the number of words in the FIFO, etc. The function "xIEmpty" can determine whether a specified FIFO is empty. The function "xIDataRead" can return a value of "1" if the data in a specified register has been read. The function "xIDataChanged" can return a value of "1" if the data in a specified register has changed since the last time that the register was read.

The listing of functions is not intended to be an exhaustive listing. Fewer or more functions can be provided as part of the HLMS library. The functions can be preprogrammed within the HLMS to ease the burden of code generation for the circuit designer. Alternatively, the circuit designer may create functions if functionality outside the preprogrammed library is needed.

Figure 3:
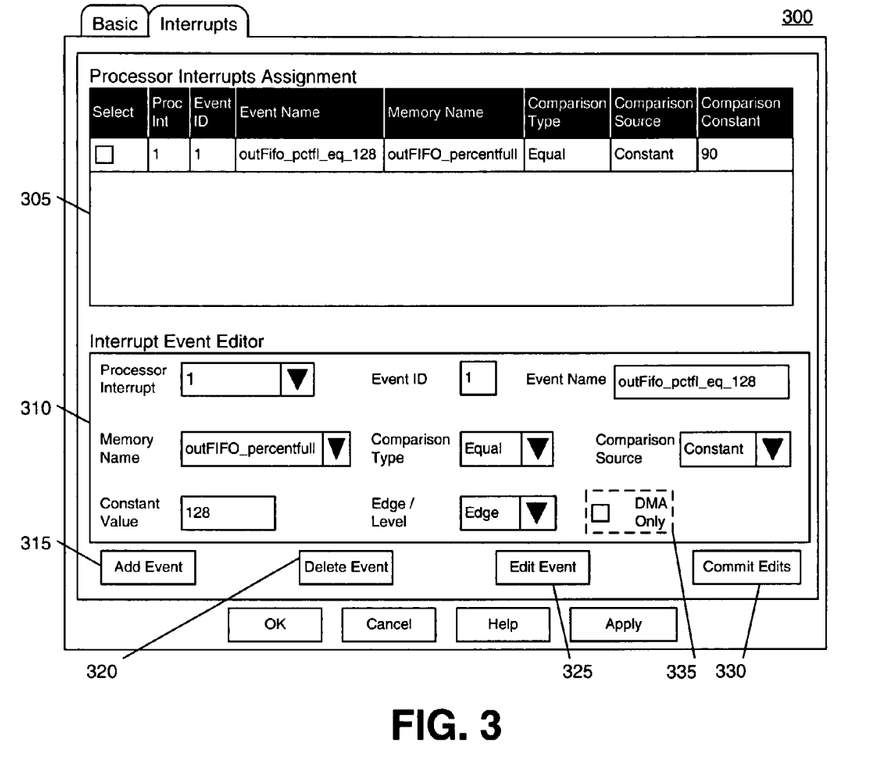
FIG. 3 is a view of a GUI of an HLMS in accordance with another embodiment of the present invention.

FIG. 3 is a view of a GUI 300 for an HLMS in accordance with another embodiment of the present invention. GUI 300 is another example of a GUI through which a circuit designer can specify events for a processor. The GUI 300, for instance, can be used as an alternative to the GUI illustrated with reference to FIG. 1. The GUI 300 includes an additional feature that allows a circuit designer to link or associate a DMA request with an event.

Window 305 of GUI 300 includes a listing of one or more interrupts that can be defined for a specified processor of the circuit design. As shown, within window 305, an interrupt called "outFifo_pctfl_eq_128" has been defined. The parameters of this event, as shown in the entry within window 305, can be specified through the various GUI elements included in window 310. Interrupts can be added by selecting the GUI element 315. Interrupts can be deleted by selecting an interrupt in window 305 and selecting GUI element 320. An existing event can be selected in window 305 and edited by selecting the GUI element 325. Edits to existing interrupts can be saved by selecting GUI element 330.

The parameters that can be defined for an event within window 310 can include the processor interrupt number, an event identifier (ID), the event name, a memory name, a comparison type, a source for the comparison, as well as a constant value for any comparisons to be made. The trigger mode for the event also can be specified. Check box 335 can be a global setting that, if selected, will alter the software drivers that are automatically generated to use DMA in lieu of polling. A description of an event interface can be generated automatically from the events specified via GUI 300.

Figure 4:
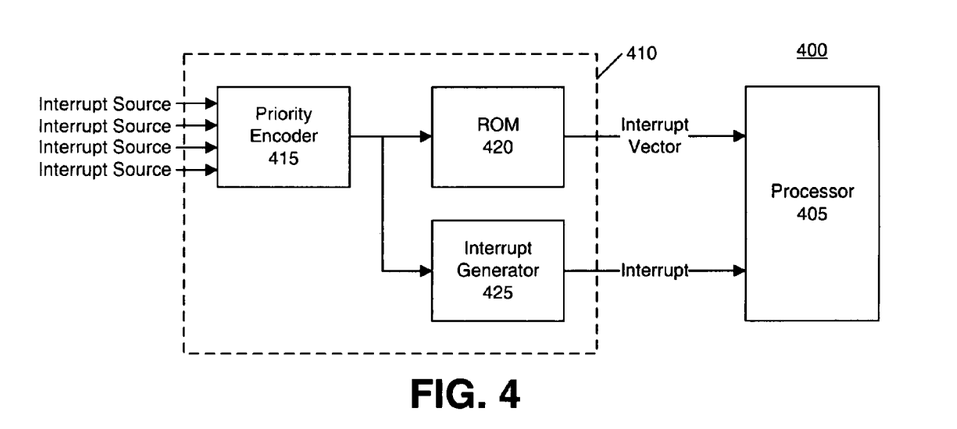
FIG. 4 is a block diagram illustrating hardware that can be generated automatically in accordance with another embodiment of the present invention.

FIG. 4 is a block diagram illustrating a portion of a circuit design 400 that can be automatically generated in accordance with another embodiment of the present invention. The various events that are defined using one or more of the GUIs described herein can be processed by the HLMS to automatically generate a description of the hardware portion of the event, in this case interrupt, interface. The hardware portion of the event interface, referred to as the event generating hardware 410, can be inserted between shared memories, peripherals, and/or user logic and the processor 405. The processor 405 can be implemented upon the same PLD as the event generating hardware 410 or can be located "off-chip". As described, each of the events can include priority attributes and trigger code defining the behavior of that event. The information can be used to create a priority encoder 415, a read only memory (ROM) 420, and an interrupt generator 425.

The priority encoder 415 can receive signals from user specified logic or other peripherals of the processor 405. Each portion of trigger code specified for an event can correspond to an interrupt source to the priority encoder 415. The priority encoder 415 can order the interrupt sources according to the specified priority for each. The ROM 420 can include an interrupt vector table including one or more interrupt vectors. The interrupt vectors of the interrupt vector table can be generated and populated automatically from the information provided through the GUIs described herein.

The priority encoder 415 can select the appropriate interrupt vector from the ROM 420 based upon which interrupt source has priority among those received. The selected interrupt vector can be provided from the ROM 420 to the processor 405. The priority encoder 415 further can instruct the interrupt generator 425 to generate an interrupt signal that is consistent with the triggering mode specified for the particular event that is detected.

It should be appreciated that the various attributes specified for events as described with reference to FIGS. 1-3 provide sufficient information such that suitable HDL code can be generated to specify the event generating hardware 410 of the event interface. The HDL code can be incorporated into a user-specified circuit description and then synthesized on a target device.

The particular circuit components illustrated in FIG. 4 are provided for purposes of illustration only. The circuit description that is generated can be a behavioral description of the event generating hardware or specify circuit elements. In any case, the circuit elements shown in FIG. 4 are illustrative of one variety of event generating hardware that can be implemented. Those skilled in the art will appreciate that the event generating hardware can be manifested in other forms using other circuit elements based upon the defined events.

Figure 5:
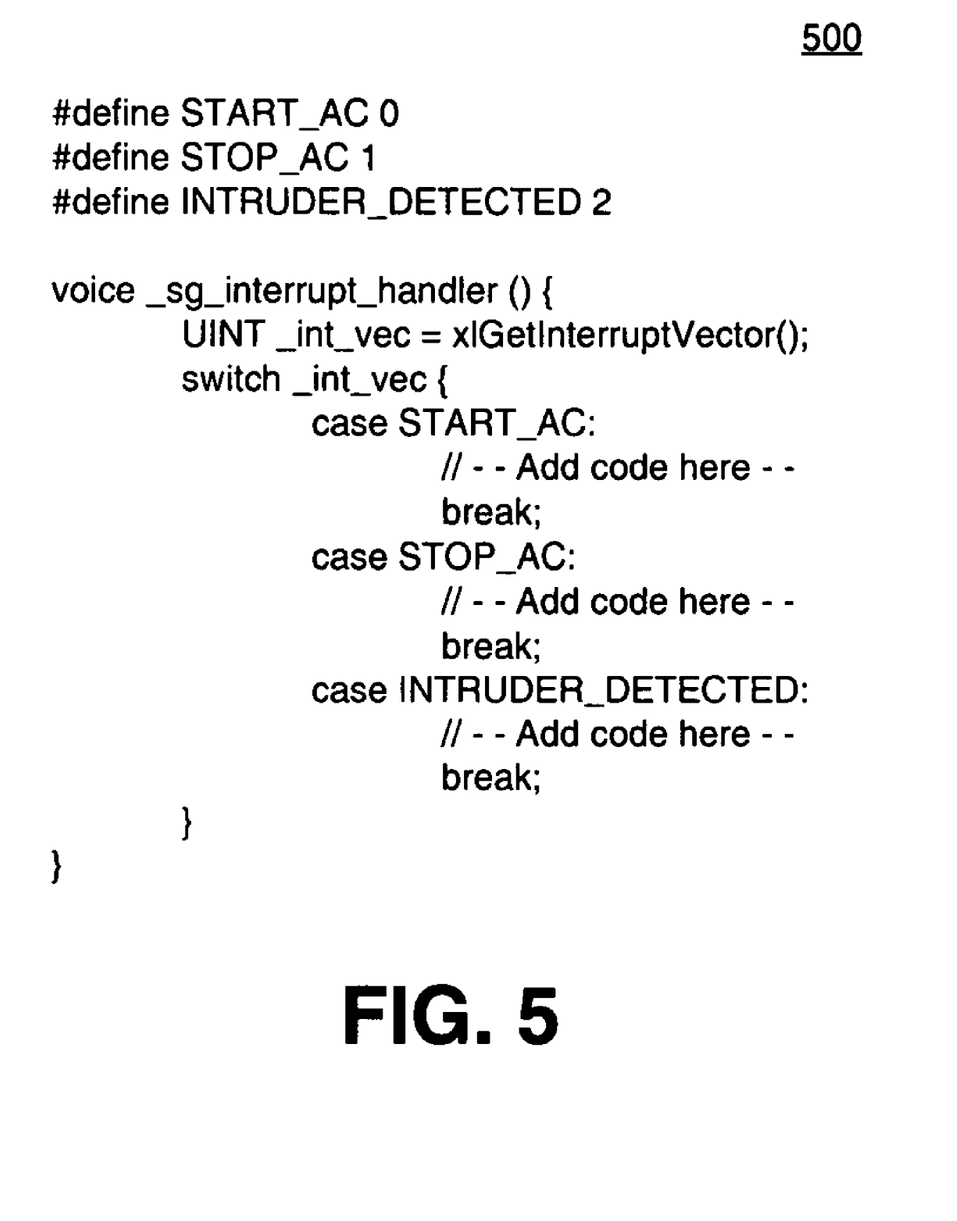
FIG. 5 is a listing of event handling software that can be automatically generated in accordance with another embodiment of the present invention.

FIG. 5 is a listing of event handling software 500 that can be automatically generated in accordance with another embodiment of the present invention. In addition to a description of the event generating hardware, event handling software 500, forming the software portion of the event interface, can be automatically generated. The event handling software 500 can include one or more event handler stubs and an event vector mask as illustrated in FIG. 5. As shown, the event handling software 500 can include a predefined function or functions that can be provided as part of the HLMS that can be loaded into the processor. The event handling software 500 can be executed by the processor upon detecting an interrupt signal. The processor can process the event vector by applying an event vector mask.

From application of the event vector mask to the event vector, the processor can decode the event vector from the ROM into sections that represent one or more of the different event labels specified via the GUIs illustrated herein. As shown, the event handling software includes stubs corresponding to each of the event labels into which a user-specified function can be inserted. Particular functions can be executed from the event handling software 500 according to which of the event labels are decoded from the event vector.

Figure 6:
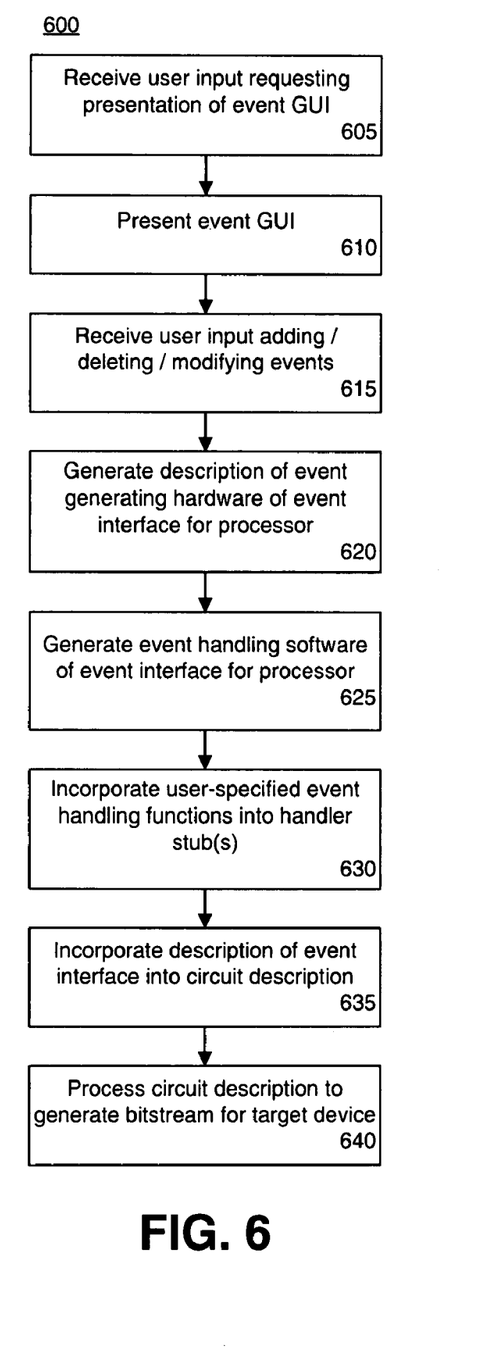
FIG. 6 is a flow chart illustrating a method of creating an event interface for a processor in accordance with another embodiment of the present invention.

FIG. 6 is a flow chart illustrating a method 600 of creating an event interface for a processor in accordance with another embodiment of the present invention. The method 600 can begin in a state in which an HLMS has loaded a programmatic circuit description, e.g., an HDL circuit description to be processed for implementation on a PLD. Accordingly, in step 605, a user input can be received that requests that the event GUI be presented. As noted, the event or interrupt GUI allows a circuit designer to add, delete, and/or modify events for a processor that is to be included into a circuit or system design.

In step 610, the event GUI can be presented to the user through the HLMS. In step 615, a user input specifying modification(s), deletion(s), and/or addition(s) to the events for the processor can be received and stored. In step 620, a description of event generating hardware for the processor can be automatically generated. For example, the description can be generated as a fragment of a netlist or as HDL code specifying the hardware portion of the event interface. In any case, as noted, the description can specify one or more circuit elements that will vary according to the defined processor events. The circuit elements, connectivity, and functionality can be governed by, and determined from, the various attributes corresponding to each of the events specified for the processor as described herein.

In step 625, event handling software can be automatically generated for the event interface according to the events specified for the processor. The event handling software can include, but is not limited to, event handler stub(s) and an event vector mask. In step 630, one or more user-provided event handling functions can be received and/or incorporated into the automatically generated event handling software. Further wizards and/or other automated guides can be included which allow the user to provide functions for handling the various events that have been defined. Such wizards or other processes can insert the user-provided code into the appropriate locations indicated by the event handler stub(s), e.g., according to event labels. In step 635, the description of the event interface, including the description of the event generating hardware and/or the event handling software, that was automatically generated can be incorporated into the circuit description that was originally loaded into the HLMS, thereby creating, or generating, an updated circuit description which can be provided as output, saved, or further processed.

In step 640, the resulting circuit description can be processed to generate a bitstream for programming the target device. Processing can include mapping the circuit design, placing the circuit design, routing the circuit design, as well as applying various optimizations known to those skilled in the art. The resulting bitstream, when loaded into a PLD, implements the circuit description and configures the PLD to function as an event interface for a processor. The event handling software can be provided as well. In the case where the processor is implemented upon the PLD, the processor can be loaded or configured with the event handling software. The resulting circuit design implementation within the PLD includes the interrupt interface that was automatically generated from the various interrupts specified through the HLMS for the processor as described herein.

The flowchart in the figures illustrates the architecture, functionality, and operation of possible implementations of systems, methods and computer program products according to various embodiments of the present invention. In this regard, each block in the flowchart may represent a module, segment, or portion of code, which comprises one or more portions of computer-usable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and computer instructions.

The present invention can be realized in hardware, software, or a combination of hardware and software. The present invention can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein.

The present invention also can be embedded in a computer program product, which comprises all the features enabling the implementation of the methods described herein. The computer program product can include a computer-usable or computer-readable medium having computer-usable program code which, when loaded in a computer system, causes the computer system to perform the functions described herein. Examples of computer-usable or computer-readable media can include, but are not limited to, optical media, magnetic media, computer memory, one or more portions of a wired or wireless network through which computer-usable program code can be propagated, or the like.

The terms "computer program", "software", "application", "computer-usable program code", variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an", as used herein, are defined as one or more than one. The term "plurality", as used herein, is defined as two or more than two. The term "another", as used herein, is defined as at least a second or more. The terms "including" and/or "having", as used herein, are defined as comprising, i.e., open language. The term "coupled", as used herein, is defined as connected, although not necessarily directly, and not necessarily mechanically, e.g., communicatively linked through a communication channel or pathway or another component or system.

This invention can be embodied in other forms without departing from the spirit or essential attributes thereof. Accordingly, reference should be made to the following claims, rather than to the foregoing specification, as indicating the scope of the invention.

What is claimed is:

1. A method of implementing a circuit design on a programmable integrated circuit (IC) comprising:
    within a computer-based design tool, displaying a list of at least one memory of the circuit design that is associated with a processor of the circuit design;
    receiving, within the computer-based design tool, a plurality of attributes of an event for the processor, wherein the plurality of attributes specify a condition that, when met within at least one memory from the list, causes a signal to be generated to the processor;
    automatically creating, according to the plurality of attributes of the event, a hardware description of an event interface to be coupled to the processor;
    incorporating the description of the event interface into a description of the circuit design; and
    generating a bitstream from the description of the circuit design that, when loaded into the programmable IC, instantiates the circuit design comprising the event interface.

2. The method of claim 1, wherein receiving the plurality of attributes of the event further comprises receiving user input specifying an event label.

3. The method of claim 1, wherein receiving the plurality of attributes of the event further comprises receiving user input comprising trigger code that is synthesizable into hardware that detects the condition that must be met in the memory to generate the event.

4. The method of claim 3, further comprising providing at least one predetermined function that determines a state of the memory, wherein the at least one predetermined function is referenced by the trigger code.

5. The method of claim 1, wherein receiving the plurality of attributes of the event further comprises receiving user input comprising a priority for the event.

6. The method of claim 1, wherein receiving the plurality of attributes of the event further comprises receiving user input comprising a trigger level for the event.

7. The method of claim 1, wherein automatically generating the description of the event interface further comprises automatically generating at least one of event generating hardware and event handling software, according to the plurality of attributes of the event.

8. The method of claim 1, wherein a plurality of events are specified, each event having a respective plurality of attributes comprising a priority, wherein automatically creating the description of the event interface for the processor further comprises generating the hardware description of the event interface for the processor according to the plurality of events.

9. A computer-implemented method of implementing a circuit design on a programmable integrated circuit (IC) comprising:
receiving user input specifying a plurality of attributes of an event for a processor of the circuit design, wherein the plurality of attributes comprises user-specified trigger code that determines a condition that, when met, causes a signal to be generated to the processor;
automatically generating an event interface comprising a description of event generating hardware and event handling software, for the processor, according to the plurality of attributes;
incorporating at least a portion of the event interface into a description of the circuit design;
storing the resulting circuit design comprising the at least a portion of the event interface; and
generating a bitstream from the description of the circuit design that, when loaded into the programmable IC, instantiates the circuit design comprising the event interface.

10. The method of claim 9, further comprising presenting a graphical user interface displaying a list of at least one memory of the circuit design that is associated with the processor, wherein the condition that exists within a memory of the circuit design is detectable by hardware synthesized from the trigger code.

11. The method of claim 9, wherein receiving user input specifying the plurality of attributes comprises receiving user input comprising a priority of the event and a trigger level for the event.

12. The method of claim 9, further comprising selecting the processor to be a direct memory access controller.

13. A computer program product comprising:
a computer-usable medium having computer-usable program code that, when executed by a computer, causes the computer to implement a circuit design for a programmable integrated circuit (IC), said computer program product including:
computer-usable program code that displays, within a computer-based design tool, a list of at least one memory of the circuit design that is associated with a processor of the circuit design;
computer-usable program code that receives, within the computer-based design tool, a plurality of attributes of an event for the processor, wherein the plurality of attributes specify a condition that, when met within at least one memory from the list, causes a signal to be generated to the processor;
computer-usable program code that automatically creates, according to the plurality of attributes of the event, a hardware description of an event interface to be coupled to the processor;
computer-usable program code that incorporates the description of the event interface into a description of the circuit design; and
computer-usable program code that generates a bitstream from the description of the circuit design that, when loaded into the programmable IC, instantiates the circuit design comprising the event interface.

14. The computer program product of claim 13, wherein the computer-usable program code that receives the plurality of attributes of the event further comprises computer-usable program code that receives user input specifying an event label.

15. The computer program product of claim 13, wherein the computer-usable program code that receives the plurality of attributes of the event further comprises computer-usable program code that receives user input comprising trigger code that is synthesizable into hardware that detects the condition that must be met in the memory to generate the event.

16. The computer program product of claim 15, further comprising computer-usable program code that provides at least one predetermined function that determines a state of the memory, wherein the at least one predetermined function is referenced by the trigger code.

17. The computer program product of claim 13, wherein the computer-usable program code that receives the plurality of attributes of the event further comprises computer-usable program code that receives user input comprising a priority for the event.

18. The computer program product of claim 13, wherein the computer-usable program code that receives the plurality of attributes of the event further comprises computer-usable program code that receives user input comprising a trigger level for the event.

19. The computer program product of claim 13, wherein the computer-usable program code that automatically generates a description of an event interface further comprises computer-usable program code that automatically generates at least one of event generating hardware and event handling software.

\* \* \* \* \*